United States Patent [19]

Smeulers et al.

[11] Patent Number: 4,748,505
[45] Date of Patent: May 31, 1988

[54] SYNCHRONIZING CIRCUIT AND SAWTOOTH GENERATOR FOR THE FIELD DEFLECTION IN A PICTURE DISPLAY DEVICE

[75] Inventors: Wouter Smeulers; Paulus J. M. Hovens, both of Eindhoven, Netherlands

[73] Assignee: U.S. Philips Corporation, New York, N.Y.

[21] Appl. No.: 98,707

[22] Filed: Sep. 18, 1987

Related U.S. Application Data

[63] Continuation of Ser. No. 885,354, Jul. 14, 1986, abandoned.

[30] Foreign Application Priority Data

Feb. 11, 1986 [NL] Netherlands ............ 8600327

[51] Int. Cl.⁴ .............................. H04N 5/04
[52] U.S. Cl. ................... 358/148; 358/150; 358/159
[58] Field of Search ............... 358/148, 150, 153, 154, 358/158, 159; 315/364, 370, 371, 378, 388, 389, 408, 397

[56] References Cited

U.S. PATENT DOCUMENTS

| | | | |
|---|---|---|---|
| 3,904,823 | 9/1975 | Van Straaten | 358/148 |
| 4,383,273 | 5/1983 | Lunn | 358/148 |
| 4,477,749 | 10/1984 | Schmale | 315/389 |

FOREIGN PATENT DOCUMENTS

0039554 11/1981 European Pat. Off.

OTHER PUBLICATIONS

Matsubara; "Vertical Blanking Control Using Vertical Retrace Signal on Interlace Scan Drive"; IBM Technical Disclosure Bulletin; vol. 22, No. 3; Aug. 1979; pp. 1061-1062.

Primary Examiner—James J. Groody
Assistant Examiner—Michael D. Parker
Attorney, Agent, or Firm—William J. Streeter; Gregory P. Gadson

[57] ABSTRACT

A synchronizing circuit and a sawtooth generator for the field deflection in a picture display device in which the sawtooth-shaped signal generated by the sawtooth generator has a retrace whose duration is switchable between a short and a longer duration. In a first use this switchover is used for eliminating the interlacing upon reception of interlaced signals, while the difference between the two durations is equal to half a line period and the switchover is effected at the picture frequency. In a second use a memory circuit is used which is an auxiliary circuit for the field synchronization, in which the shorter duration of the retrace period is switched over to in the absence of a plurality of successive incoming field synchronizing pulses, which plurality is not higher than a predetermined value.

17 Claims, 2 Drawing Sheets

SYNCHRONIZING CIRCUIT AND SAWTOOTH GENERATOR FOR THE FIELD DEFLECTION IN A PICTURE DISPLAY DEVICE

This is a continuation of application Ser. No. 885,354, filed July 14, 1986, now abandoned.

BACKGROUND OF THE INVENTION

The invention relates to a circuit arrangement for the field deflection in a picture display device, comprising a sawtooth generator for generating a sawtooth-shaped signal having a trace and a retrace, and a field synchronizing circuit for generaing a local field signal and for applying this signal to the sawtooth generator for each time initiating the retrace of the generated sawtooth-shaped signal, and for synchronizing the locally generated field signal with an incoming field synchronizing signal.

A circuit arrangement of this type is fairly generally known, for example, from U.S. Pat. No. 4,383,273. The sawtooth-shaped signal obtained is applied to a field deflection amplifier applying a current to a field deflection coil for vertically deflecting one or more electron beams generated in a picture display tube. The field deflection current is also sawtooth-shaped but the duration of its retrace does not need to be the same as that of the retrace of the signal generated by the sawtooth generator, because the variation of the said current also depends on the inductance of the deflection coil. In the known circuit arrangements the sawtooth generator is at will designed to obtain a signal of a well defined shape, that is to say, its trace and retrace have given durations.

The invention is based on the recognition that a variation of the shape of the sawtooth-shaped signal may be desirable to increase the flexibility of the circuit arrangement and to this end the circuit arrangement according to the invention is characterized in that it is provided with a switch operated by a control stage for switching over the duration of the retrace period between a first and a second value, the second duration being shorter than the first.

Since according to the invention the duration of the retrace period is switchable between two values, it will be evident that the trace period may also have two durations. In the nominal state of the field synchronizing circuit in which the incoming signal is a standard signal, that is to say, in accordance with a standard at which the repetition frequency of the field synchronizing pulses has a prescribed constant value and in which the locally generated field signal is in synchronism with the incoming signal, the retrace of the sawtooth shape at a constant field frequency is in fact initiated at fixed instants between which the intervals, the field periods, have a prescribed constant duration. In spite of the measure according to the invention the instants of commencement of the field periods remain temporarily fixed, that is to say, they are not shifted so that other signals derived from the generated sawtooth such as, for example, the field blanking pulses are also fixed, whilst the circuit arrangement can be used for several purposes.

In one embodiment the circuit arrangement according to the invention is characterized in that a pulse shaper for deriving a signal from the local field signal for the supply thereof, to the sawtooth generator is connected to the field synchronizing circuit, which signal has substantially the same duration as the retrace of the sawtooth-shaped signal generated by the sawtooth generator, the pulse shaper including a switch for shortening or lengthening the duration of the said signal.

In this case, the sawtooth generator comprising a capacitor and means for successively charging the capacitor during the trace period and discharging it during the retrace period, the circuit arrangement may be characterized in that in the state of the switch in the said pulse shaper in which the retrace period has the first duration, the signal generated by the pulse shaper temporarily interrupts the discharging of the capacitor.

In a first use the circuit arrangement according to the invention is characterized in that for eliminating the interlacing of a picture to be displayed on a picture display tube upon reception of a video signal with interlacing the control signal applied by the control stage to the switch has the picture frequency for obtaining a sawtooth-shaped signal in which the retrace period alternately has the first and the second duration and in which the difference between the first and the second duration is equal to half the line period in the incoming video signal.

Circuit arrangements for eliminating the interlacing upon reception of interlaced video signals, for example, when the picture to be displayed consists of digitally generated picture and/or text information signals are known per se. For example, in European patent application No. 39,554 the interlacing is eliminated in that the field synchronizing signal is alternately delayed by half a line period and not delayed, respectively. Consequently, the instant of commencement of the period of a sawtooth-shaped signal is alternately shifted or not shifted, which produces a picture frequency variation of this instant and may cause difficulties in generating other field signals, for example, the field blanking pulses. On the other hand the measure proposed here only produces a very small amplitude variation of the sawtooth-shaped signal which is little troublesome and can be eliminated in a simple manner.

A circuit arrangement of the type described above may be characterized in that a memory circuit comprising a memory element is connected to the sawtooth generator, as well as a source for applying information to the memory element and a source for removing information from this element, which circuit also comprises a control loop for controlling the quantity of information stored in the memory element, which information has a predetermined substantially constant value when the interval between incoming field synchronizing pulses has a predetermined duration and a value deviating therefrom in the opposite case.

In a second use of the switch-over according to the invention this memory circuit may be used so that an improvement of the field synchronizing is obtained. To this end the circuit arrangement is characterized in that the memory circuit comprises a comparison stage coupled to a counter for comparing the difference between information derived from the peak of the sawtooth-shaped signal and the information stored in the memory element with a reference for each time initiating the retrace and for each time applying a signal to the control stage for changing over the switch to the state in which the retrace period has the second duration, the interval between the instants of commencement of the retrace periods being equal to the said predetermined duration, and this in the absence of a plurality of successive incoming field synchronizing pulses, which plurality is not higher than a predetermined value.

BRIEF DESCRIPTION OF THE DRAWINGS

Other aspects of the invention are elaborated in appended Claims. The invention will now be described in greater detail by way of example with reference to the accompanying Figures.

DETAILED DESCRIPTION OF THE INVENTION

Figure 1:
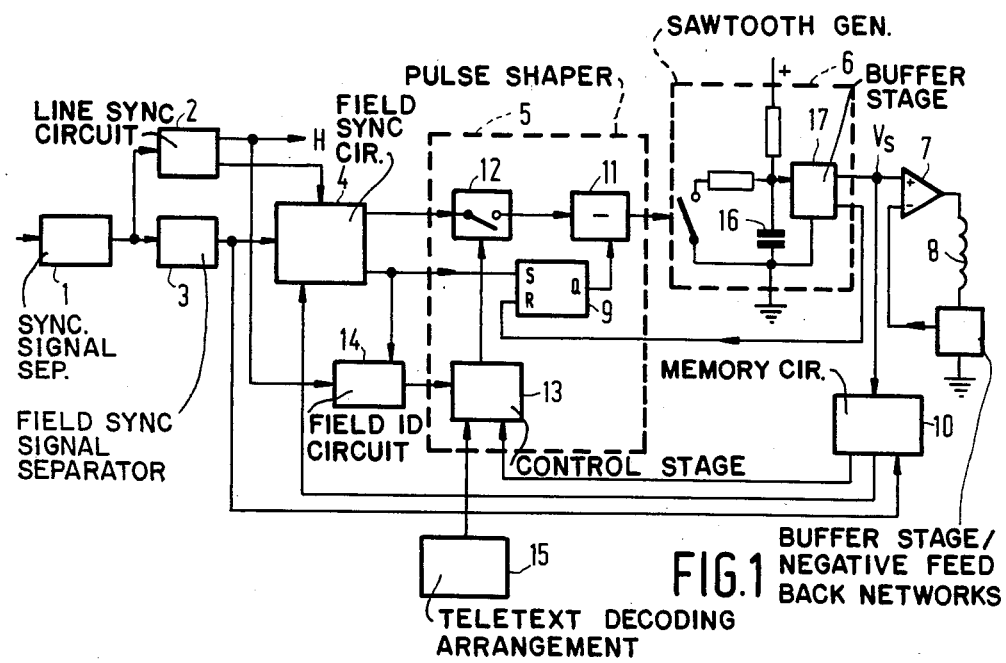
FIG. 1 shows a part of a picture display device, for example, a television receiver including the circuit arrangement according to the invention.

FIG. 1 is a simplified diagram of a part of a picture display device relevant to the invention. An incoming video signal is applied to a synchronizing signal separator 1. A synchronizing signal present in the video signal is derived by a separator 1 and is applied to a line synchronizing circuit 2. Circuit 2 is formed in known manner as a phase control loop for generating a local line frequency signal which is substantially in synchronism with the line synchronizing signal present in the synchronizing signal and which is further processed for the purpose of horizontal deflection in a picture display tube not shown.

The synchronizing signal is also applied to a field synchronizing signal separator 3 with which a field synchronizing signal present in the incoming synchronizing signal is derived and is applied to a field synchronizing circuit 4. A local field signal is generated by circuit 4. For this purpose this circuit comprises a frequency divider circuit which reeives a signal of the double line frequency as a clock signal which originates from the line synchronizing circuit 2. Under nominal circumstances the frequency divider circuit, which is a counter, generates a signal which is subtantially in synchronizing with the incoming field synchronizing signal. For this purpose the counter counts, for example, 625 clock pulses per field period of 20 ms (European television standard). If the incoming signal is a standard signal and if the synchronous state has prevailed for a predetermined time, the supply of the field synchronizing signal is interrupted, while the counter is reset after the 625th clock pulse period and a signal derived from the counter is further processed for the purpose of vertical deflection in the picture display tube (indirect synchronization). For this purpose this signal is applied to a pulse shaper 5 for obtaining a signal having the suitable form as a function of time, which signal is applied to a sawtooth generator 6. Generator 6 generates a sawtoothed-shaped voltage which is converted by an output amplifier 7 into a sawtooth-shaped current flowing through a field deflection coil 8. The field output stage may also comprise provisions, for example, buffer stages and/or negative feedback networks for obtaining a desired variation for the field deflection current through coil 8 and for obtaining a constant amplitude of this current if the circuit is also suitable for another field frequency.

On the other hand, if the incoming field synchronizing pulses do not occur during the 625th clock pulse period of the counter in circuit 4 during a predetermined number of field periods, this circuit is changed over to a direct synchronization state in which the counter is reset by an incoming synchronizing pulse.

The foregoing is well known to those skilled in the art. A field synchronising circuit of this type is described, for example, in U.S. Pat. No. 3,904,823 the text of which is incorporated herein by reference. However, in FIG. 1 pulse shaper 5 is implemented in a new manner, more specifically for switching over, under circumstances, the duration of the retrace period of the sawtooth shape, i.e. the shortest interval in the period. Pulse shaper 5 has a flip-flop 9 whose set input is connected to the field synchronizing circuit 4 and whose reset input is connected to generator 6. An output of flip-flop 9 is connected to an input of a subtractor stage 11, another input of which is connected to a switch 12. Switch 12 is operated by a control stage 13. The output signal of subtractor stage 11 is also the output signal of pulse shaper 5. If switch 12 conducts under the influence of stage 13, the said output signal is the difference between the input signals of stage 11. In the opposite case the said output signal is the output signal of flip-flop 9.

Figure 2A:
FIGS. 2a-2d show waveforms occurring therein.

The signal at the said input of flip-flop 9 is the previously mentioned local field signal and corresponds to the counting number 0 of the counter in the field synchronizing circuit 4, i.e. the counting number 625 of the preceding field period if circuit 4 operates in synchronism with an incoming standard field synchronizing signal. Under these circumstances flip-flop 9 is set by a pulse indicating the end of a field period and also the beginning of the subsequent field period. The leading edge of the pulse generated by flip-flop 9 initiates the retrace of the sawtooth shape. Generator 6 includes a capacitor 16 which is charged during the trace period, i.e. the longest interval in the period. Due to the occurrence of the said leading edge, hence from the counting position 0, capacitor 16 is discharged until the voltage across the capacitor reaches a given fixed level. In the non-conducting state of switch 12 this discharge process has a duration of approximately 7 clock pulse periods of the counter in circuit 4, that is to say, 7 half line periods whereafter a reset signal is applied to flip-flop 9 by generator 6 via a buffer stage 17. This determines the end of the pulse generated by flip-flop 9 and also the beginning of the trace of the sawtooth shape. In FIG. 2a the signal applied to generator 6 and in FIG. 2b the generated sawtooth shape are plotted as a function of time. It is apparent from the foregoing that the trace period in question has a duration of approximately 618 clock pulse periods.

A pulse which is applied to switch 12 is generated in known manner by the field synchronizing signal circuit 14 during the third clock pulse period of the counter. In the conducting state of the switch the signal applied to generator 6 has the shape shown in FIG. 2c, namely with a high level during two clock pulse periods after the instant of commencement of the field period, subsequently, a low level during the third clock pulse period and then a high level again. The sawtooth-shaped voltage generated under these circumstances by generator 6 has the variation shown in FIG. 2d in which the discharge of the capacitor 16 is interrupted during the third clock pulse period. The result is that the voltage level determining the end of the discharge process is reached one clock pulse period later than when switch 12 is non-conducting, i.e. the retrace lasts until approximately the end of the eighth clock pulse period at which instant the signal of FIG. 2c has a downwardly directed trailing edge. Since the subsequent retrace is initiated at 625 clock pulse periods after the commencement of the first considered retrace, this means that the trace period now has a duration of approximately 617 clock pulse periods. If the slope of the sawtooth shape during the trace period is the same in FIG. 2d as in FIG. 2b, i.e. if the charge current of capacitor 16 is the same in both cases, the amplitude of the sawtooth shape in FIG. 2d is slightly smaller than the amplitude in FIG. 2b.

The picture display device, of which the circuits of FIG. 1 form part, is adapted to receive and display interlaced video signals. Under circumstances an interlaced display is, however, undesirable, for example, for the display of digitally generated picture and/or text information signals. Such signals are generated, for example, by a character generator or by a teletext decoding arrangement. In such a case it is known to eliminate the interlacing for which a number of proposals have been made in the past. FIG. 1 shows a field identification circuit 14 which receives the local line signal from the line synchronizing circuit 2 and the local field signal from the field synchronizing circuit 4, which signal corresponds to the counting position 0 of the counter. A square-wave signal is generated in known manner by circuit 14 at the picture frequency, i.e. half the field frequency, and at the correct phase. Whenever the counting position 0 occurs, an edge occurs in this signal. This signal is applied to control stage 13 resulting in switch 12 conducting during a field period, at least during its retrace period, and not conducting during the subsequent field period. For this purpose control stage 13 receives a signal which originates, for example, from a teletext decoding arrangement 15 and which comprises the information that teletext signals are being received. The output signal of pulse shaper 5 is the signal of FIG. 2a and alternately shows a field retrace having a duration of approximately 7 and 8 half line periods, respectively. It appears from FIG. 2b, which shows the sawtooth shape generated during two successive field periods, that the consecutive field trace periods are alternately approximately 618 and 617 half line periods long. In the absence of information from arrangement 15, switch 12 is operated by stage 13 in such a manner that this switch conducts each field period resulting in the signals of FIG. 2c and in the sawteeth of FIG. 2d in which each field retrace has a duration of approximately 8 half line periods and each field trace has a duration of approximately 617 half line periods, consequently, approximately 308½ line periods.

Figure 2B:
Figure 2C:
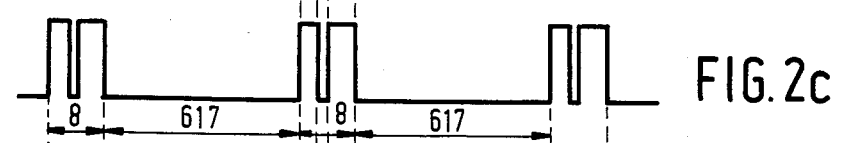
Figure 2D:
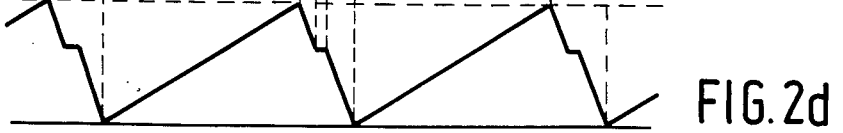

In FIG. 2d a field trace starts approximately simultaneously with a line period and it ends approximately at half the subsequent 309th line period. The subsequent field trace starts 4 line periods later at approximately half a line period. In this case the display is interlaced. On the other hand, in the case of FIG. 2b the first field trace shown starts approximately simultaneously with a line period and it ends approximately at the end of the subsequent 309th line period. The subsequent second field trace starts 4 line periods later approximately at the end of a line period, i.e. also approximately at the beginning of a line period. The second field trace ends approximately at half the 309th line period, but since the subsequent retrace takes approximately 7 half line periods, the third field trace will also start approximately at the beginning of a line period. This shows that the display in the case of FIG. 2 is non-interlaced. This result can also be explained by noting that in FIG. 2b the instant of commencement of the field trace occurs half a line period earlier at every other field period. Due to tolerances, the two possible values of the discharge time of capacitor 16 cannot be determined accurately, but the difference between these values, namely half a line period, is accurate.

It will be noted that the correct periodicity is obtained for the sawtooth-shaped signal of FIG. 2b because the instant of commencement of the field period, i.e. the above-mentioned counting position 0, coincides with the instant of commencement of the retrace, i.e. the instant of commencement of the discharge process of the capacitor in generator 6. In this manner the sequence 7+618, 8+617, ..., for both intervals of the field period, i.e. 625, 625, ..., is obtained. If on the other hand the counting position 0 coincides with the instant of commencement of the charge process of the capacitor, the faulty sequence 617+7, 618+8, ..., i.e. 624, 626, ..., would be obtained. A field blanking pulse, for example, could not be derived from generator 6.

It will also be noted that the sawtooth shape of FIGS. 2b and 2d has a short interruption when the retrace covers 8 half line periods. Due to the high inductance of the deflection coil 8 this, however, does not have any consequence for the field deflection current. Furthermore, the amplitude of the sawtooth shape in FIG. 2b undergoes a very small picture frequency variation. The field deflection current will, howver, not undergo a similar variation thanks to a suitable design of the field output stage and particularly to the design of negative feedback networks operating therein. The picture frequency component may also be eliminated by a changeover of the charge current of capacitor 16, more specifically such that the value of this current is slightly higher after a retrace with a duration of 8 half line periods than after a retrace with a duration of 7 half line periods.

Figure 3:
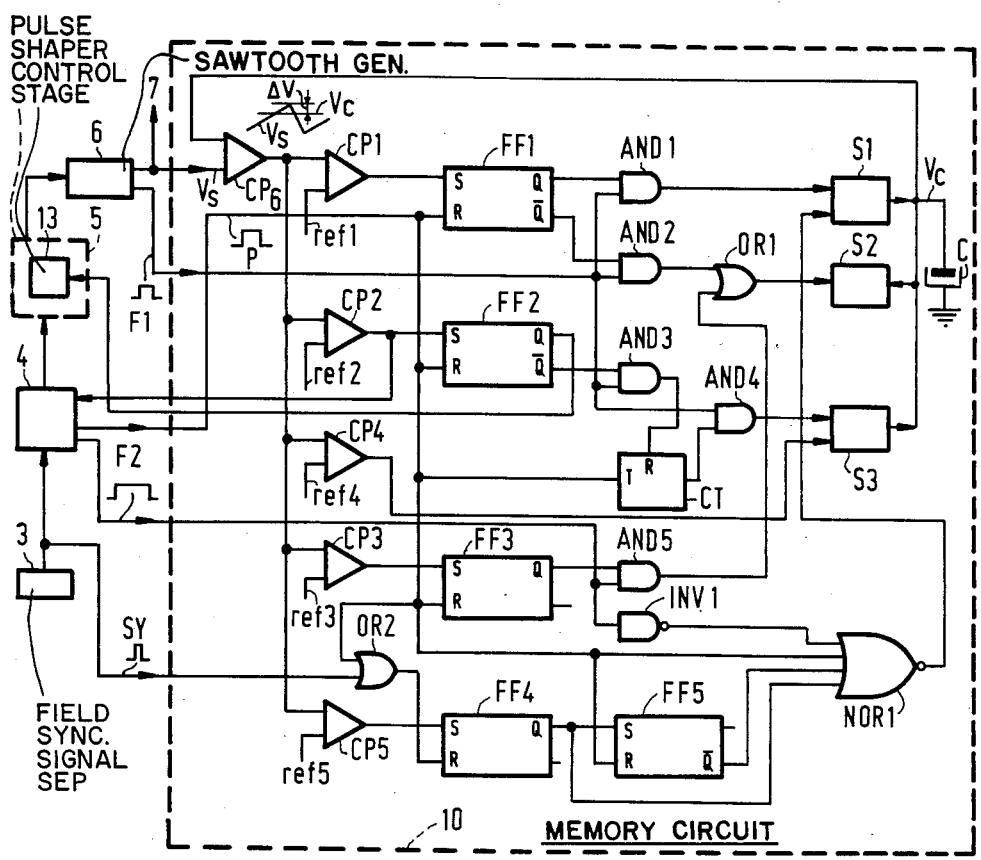
FIG. 3 shows a detailed diagram of a memory circuit forming part of the circuit arrangement of FIG. 1

The sawtooth-shaped voltage $V_S$ of generator 6 is also applied to a memory circuit 10 which is an auxiliarly circuit for the field synchronization. FIG. 3 is a diagram of circuit 10 in which the same components as those in FIG. 1 have the same reference numerals. Circuit 10 comprises six comparison stages CP1, CP2, CP3, CP4, CP5 and CP6 and five flip-flops FF1, FF2, FF3, FF4 and FF5. Stage CP6 operating as a subtractor stage and amplifier compares voltage $V_S$ with the voltage $V_c$ which is present across a capacitor C and the difference $\Delta V = V_S - V_c$ between the two input voltages is amplified many times. The output voltage of stage CP6 is applied to the other comparison stages CP1, CP2, CP3, CP4 and CP5. The said output voltage is compared in each of these stages with a reference voltage, namely ref1, ref2, ref3, ref4 and ref5, respectively. The comparison stages CP1 through CP5 are thus operative as level detectors. The output voltage of stage CP1 is applied to the set input of flip-flop FF1, while the output voltage of stage CP2 is applied to the set input of flip-flop FF2 and the output voltage of stage CP3 is applied to the set input of flip-flop FF3. A positive pulse P which originates from the field synchronizing circuit 4 and occurs during the trace period, for example, between the counting numbers 480 and 512 of the counter in circuit 4 is applied to the reset inputs of flip-flops FF1, FF2 and FF3.

The first reference voltage ref1 has a value of only several millivolts. When voltage $V_S$ exceeds the value of voltage $V_c$ by the value of voltage ref1 at the end of the trace, the output voltage of stage CP1 is high. A noninverted output Q of flip-flop FF1 is thus high, while the inverted output $\overline{Q}$ is low. Output Q is connected to an input of an AND-gate AND1 another input of which receives a positive retrace pulse F1 which originates from generator 6, i.e. a pulse whose edges coincide with the leading edge and the trailing edge, respectively, of the signal shown in FIG. 2c. The output $\overline{Q}$ of flip-flop FF1 is connected to an input of an AND-gate AND2 another input of which receives the same pulse F1. The output of gate AND1 is connected to a charge source S1 for charging capacitor C, while the output of gate AND2 is connected via an OR-gate OR1 to a discharge source S2 for discharging capacitor C. Source S1 is a current source for applying current to capacitor C and a current can be withdrawn from the capacitor by source S2. In the case stated, when Q is high while $\overline{Q}$ is low, capacitor C is charged by source S1 during the occurrence of pulse F1 so that voltage $V_c$ increases. If on the other hand the value of voltage $V_S$ at the end of the trace is lower than the sum of voltages $V_c$ and ref1, flip-flop FF1 is not set. Output Q is low while $\overline{Q}$ is high so that source S2 is operative and source S1 is inoperative during the occurrence of pulse F1. Capacitor C is discharged and the voltage $V_c$ thereacross decreases.

It is apparent from the foregoing that in the described state of the circuit voltage $V_c$ has a constant value, provided that the capacitance of capacitor C is high enough, more specifically of the order of 10 μF, on which constant voltage a square-wave ripple voltage of the picture frequency having a very small amplitude is superposed. In this state the sawtooth $V_S$ generated by generator 6 has a substantially constant amplitude. This is the state shown in FIG. 2d and occurring if the consecutive field periods each have the nominal duration of 625 clock pulse periods. Voltage ref1 thus corresponds to a number of 625 clock pulse periods per field period.

The second reference voltage ref2 has a value which is higher than that of voltage ref1 and which corresponds to a number of approximately 626 clock pulse periods. If the field synchronising circuit 4 is in its direct synchronization state and if there is no incoming field synchronizing signal before or during the 625th clock pulse period, for example, because the incoming field synchronizing signal is not a standard signal, then the counter in circuit 4 continues to count after the occurrence of the counting number 625 and voltage $V_S$ continues to increase so that the substantially constant level of voltage $V_c$ is exceeded. Flip-flop FF2, which has reset by pulse P, is set by the output signal of comparison stage CP2 at the instant when the difference Δ V reaches the value of voltage ref2. The said output signal is also applied to circuit 4 for resetting the counter, i.e. approximately at the counting number 626, while the signal at a non-inverted output Q of flip-flop FF2, which signal has now become high, is applied to control stage 13. Stage 13 renders the switch 12 in pulse shaper 5 non-conducting. When the difference Δ V has reached the value ref2, a shortened retrace of approximately 7 half line periods is thus initiated.

The inverted output $\overline{Q}$ of flip-flop FF2 is connected to an input of an AND-gate AND3 another input of which receives the retrace pulse F1 and whose output is connected to the reset input of a 3-counter CT. The toggle input of counter CT receives pulse P. An input of an AND-gate AND4 is connected to the output of counter CT, another input receives pulse F1 and the output is connected to a charge source S3 for rapidly charging capacitor C. When it operates, S3 generates a charge current which is many times larger than the current generated by source S1. At the instant when voltage Δ V has become equal to ref2, the signal at the output $\overline{Q}$ of flip-flop FF2 becomes low. During the subsequent trace period, more specifically during the occurrence of pulse P, counter CT starts counting while flip-flop FF2 is reset.

Since the previous retrace has had a duration of approximately 7 half line periods, the counting position 625 of the field period now considered occurs 625 half line periods after the commencement of this period. If a field synchronizing pulse has arrived, a new retrace is initiated because the counter in circuit 4 is reset by this pulse while flip-flop 9 is set. The difference Δ V remains lower than the value of ref2, so that stage CP2 and flip-flop FF2 do not flip over. Stage 13 thus does not receive a high signal from flip-flop FF2 and the new retrace acquires the unshortened duration of approximately 8 clock pulse periods, while the output $\overline{Q}$ of flip-flop FF2 is high so that counter CT is reset. If on the other hand there is again no field synchronising pulse, the operation already described is repeated, that is to say, the encounter in circuit 4 is reset approximately at the counting number 625, because the retrace has the shortened duration and so that the level ref2 is exceeded half a line period earlier than was otherwise the case. Counter CT is not reset and thus continues to count.

When the situation described hereinbefore has occurred three times, counter CT applies a signal to gate AND4 resulting in source S3 being rendered operative during the occurrence of the next pulse F1. Capacitor C is rapidly charged and the voltage $V_c$ thereacross rapidly increases. Voltage $V_c$ becomes higher than the peak value of the sawtooth-shaped voltage $V_S$ so that stage CP2 no longer applies an output signal to flip-flop FF2 and circuit 4. Since the counter in circuit 4 is not reset after the occurrence of the counting number 625, this resetting can still take place upon the arrival of a field synchronizing pulse, whereafter the described operation of stages CP1 or CP2 starts again while voltage $V_c$ decreases again. If on the other hand a field synchronizing pulse is still not present before the end of the trace period, for example, due to noise and/or interferences, voltage $V_c$ increases during the retrace which is initiated after counter CT has counted up to 3. Voltage $V_c$ reaches a level which corresponds to a counting number which is higher than 626. At the instant when voltage $V_S$ exceeds this level by a value which is equal to voltage ref2, stage CP2 starts operating again so that a new retrace is initiated during which capacitor C is charged by source S3. This shows that the trace period each time becomes longer, which corresponds to a decrease of the free-running frequency, and that voltage $V_c$ becomes higher each time during the retrace period. The retrace period also becomes longer because voltage $V_S$ is each time higher at the start thereof. It will be evident that when one synchronizing pulse is missed, the trace period may be given a duration which is longer than 626 clock pulse periods, in which case the subsequent retrace period is to be shortened by more than one clock pulse period.

The third reference voltage ref3 has a value which is many times higher than the value of ref1 and which corresponds to a higher level than the level measured by stage CP1, which level corresponds to 625 clock pulse periods after the commencement of the field period. The value of voltage ref3 corresponds, for example, to 672 clock pulse periods, i.e. the longest possible duration of the field period which is determined by circuit 4. This means that flip-flop FF3, which is each time reset by pulse P, is set as soon as voltage $V_S$ reaches this level. A noninverted output Q of flip-flop FF3 then applies a high signal to an input of an AND-gate AND5 another input of which receives a positive retrace pulse F2 originating from the counter in circuit 4 and having a longer duration than pulse F1, for example, 256 clock pulse periods after the counting position 0 which initiates the field period. The output of gate AND5 is connected to a second input of gate OR1. During the occurrence of pulse F2 capacitor C is discharged by source S2. Due to the long duration of pulse F2, the charge of capacitor C has considerably decreased after a field period. This shows that voltage $V_c$ cannot exceed the level which corresponds to 672 half line periods and becomes lower as soon as this level has been reached, and that the field period cannot be longer than this duration, i.e. 21.5 ms instead of 20 ms in the nominal state, which corresponds to a frequency of 46.5 Hz instead of 50 Hz. When the said level is reached, stage CP2 in fact starts operating so that a new retrace is initiated. It is apparent from the foregoing that a rapid and interference-insensitive pull-in is obtained after synchronization is lost, with voltage $V_c$ rapidly returning to the normal value thereof. Moreover a safeguard is obtained for the case when voltage $V_c$ far exceeds the normal value for some reason or other.

The fourth reference voltage ref4 has a value which is many times higher than the value of ref1 and which corresponds to approximately 100 clock pulse periods below the level measured by stage CP1. During the normal operation, either in the synchronous state or in the non-synchronous state, comparison stage CP4 does not operate. When the picture display device is switched on, however, the difference $\Delta V$ is higher than the value of voltage ref4 after a short time, because voltage $V_c$ is then zero so that stage CP4 applies a signal to source S3 for activating this source. In this manner capacitor C is rapidly charged in spite of the fact that the capacitance of capacitor C is much higher than that of capacitor 16 so that the steady state is rapidly achieved. This part of the circuit also ensures a safeguard if voltage $V_c$ decreases to far below the normal value for some reason or other.

It is apparent from the foregoing that circuit 10 comprises a control loop for controlling the information which is stored in a memory element having the form of capacitor C. Under nominal circumstances, that is to say, at a field period of 625 clock pulse periods, the information in the memory element corresponding to the voltage $V_c$ across the capacitor is substantially constant because the level of voltage $V_c$ is always maintained at the peak of the sawtooth. If the field synchronizing circuit 4 is in its direct synchronizing state, for example, because the incoming video signals are not standard signals, and if field synchronizing pulses are missed during the nominal duration of the field period, for example, because the incoming signal comprises much noise or because these pulses do not have an adequate amplitude for some reason or other, the control loop is operative for temporarily taking over the synchronization. When fewer than three synchronizing pulses are missed, the loop ensures that the synchronization is not lost and each successive field period has the nominal duration of approximately 625 half line periods because the retrace period is each time shortened. When more than three synchronizing pulses are missed, the operation of the loop gradually extends the duration of the field period, more specifically to a maximum of 672 half line periods, while synchronization takes place, either when a synchronising pulse occurs if this occurrence is within the period of an extended field period, or at the end of the field period in the absence of a synchronizing pulse. In the case of an extended field period the voltage across capacitor C acquires a higher value, while the amplitude of the sawtooth becomes larger. In the operation shown of circuit 10 the voltage across capacitor C at the commencement of a field period is an information about the amplitude and consequently about the duration of the previous field period, which information can be changed rapidly if required. It will be evident that capacitor C may be replaced by another type of memory, for example, a digital memory, whereby other parts of the circuit may be replaced in known manner by digital elements.

If the incoming video signal originates from a picture pick-up and display device which is operative in a special mode, that is to say, for example, for stationary, slow-motion or fast display, the stable operation of the synchronization may be deteriorated by the control loop, however. When a field synchronizing pulse occurs before the end of a period of the sawtooth, there is no disadvantage, but on the other hand when a field synchronizing pulse occurs after the end of a period, there should be an immediate change-over to direct synchronization, that is to say, without waiting for three periods and without waiting for the own waiting time of circuit 4, more specifically because of the fact that in the case of a special mode in which a variation of the repetition frequency of the field synchronizing pulses may take place there is a rather great risk that the subsequent field synchronizing pulses will also occur after the end of the relevant periods.

The part of the circuit of FIG. 3 comprising comparison stage CP5 ensures that the control loop described is rendered inoperative in the case of a special mode of a picture pick-up and display device applying a video signal to the picture display device in question. For this purpose the phase is measured between the instant of commencement of the retrace and the incoming field synchronizing pulse. The fifth reference voltage ref5 has a value which is substantially equal to that of voltage ref2. Thus, stage CP5 may be omitted, while its function is fulfilled by stage CP2. The output of comparison stage CP5 is connected to the set input of flip-flop FF4 whose reset input is connected to the output of an OR-gate OR2. The pulse P already mentioned is applied to another input of gate OR2 and the field synchronizing pulse SY originating from the field synchronizing signal separator 3 is applied to another input of gate OR2. A non-inverted output Q of flip-flop 4 is connected to the set input of flip-flop FF5 and to an input of a NOR-gate NOR1 another input of which is connected to an inverted output $\overline{Q}$ of flip-flop FF5. Pulse P is also applied to the reset input of flip-flop FF5 and to a further input of gate NOR1. Gate NOR1 also receives a pulse $\overline{F2}$ via an inverter stage INV1, which pulse is the reverse of pulse F2 and the output of gate NOR1 is connected to change source S1.

During the occurrence of pulse P both flip-flops FF4 and FF5 are reset so that the signal at the output $\overline{Q}$ of flip-flop FF5 is high, while the signal at the output Q of flip-flop FF4 is low. The output signal of gate NOR1 is thus low. If the synchronising pulse Sy occurs before the end of the field period, this situation does not change and the input voltage Δ V of stage CP5 does not reach the value of voltage ref5. If on the other hand there is no pulse SY, the input voltages of stage CP5 become equal at a given instant so that the two flip-flops FF4 and FF5 are set, while approximately at the same instant stage CP2 applies a reset signal to the field synchronising circuit 4, which initiates a new field period. Since the signal at the output Q of flip-flop FF4 is now high, while the signal at the output $\overline{Q}$ of flip-flop FF5 is low, the output signal of gate NOR1 remains low. This situation is maintained as long as there is no pulse SY, so that the above-described operation of the control loop does not undergo any change.

Figure 4:
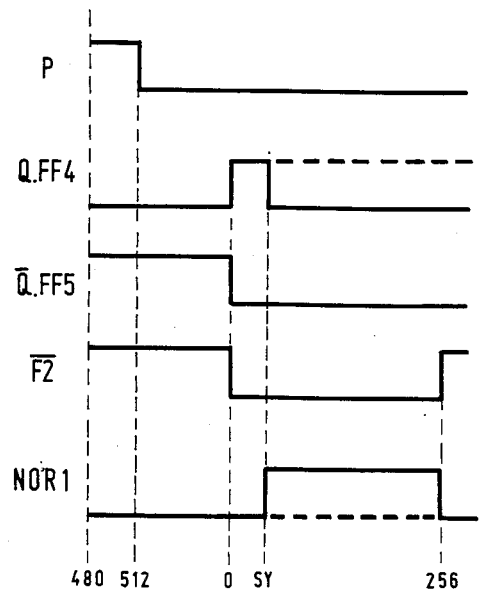
FIG. 4 shows waveforms occurring in the memory circuit of FIG. 3.

When an incoming field synchronising pulse SY occurs at an instant which is later than the instant of commencement of the new field period, the signal at the output Q of flip-flop FF4 becomes low, while the signal at the output $\overline{Q}$ of flip-flop FF5 remains low. Since the level of pulse P after the counting position 512 of the previous field period is low and since the level of pulse $\overline{F2}$ is also low from the commencement of the new field period, the signal at the output of gate NOR1 becomes high. The result is that capacitor C is charged by source S1 from the occurrence of pulse SY so that voltage $V_c$ increases. This situation is maintained until the end of pulse F2, i.e. up to the counting position 256. Due to the long duration of the charge period, voltage $V_c$ considerably increases during a field period. At the end of the period the sawtooth-shaped voltage $V_S$ generated by generator 6 does not reach the level voltage $V_c$. Voltage $V_c$ reaches a higher level at which direct synchronisation is possible. FIG. 4 shows by way of illustration the waveforms which have been described with words hereinbefore and in which the broken lines denote the the case when no synchronising pulse occurs.

It will be noted that the control is rendered inoperative after stage CP2 has been operative, that is to say, the control has still been operative. However, this faulty situation occurs only once, whereafter the control is inoperative, more specifically as long as pulse SY occurs each time after the end of the field period while voltage $V_c$ remains at a high level. It will be evident that a digital memory, for example, a flip-flop instead of capacitor C involves an improvement because the memory information remains more constant in that case. It will also be evident that a large number of components may be replaced by other components, provided that the functions described do not undergo any change. It will be evident to anyone skilled in the art in which way, for example, the logic stages in FIG. 3 may be replaced by other ones. It will also be evident that some numbers given in relation with parts of circuit 10 may be chosen at will, for example, the number of fields counted by means of counter CT and the counts at which the different pulses commence and end, respectively.

Finally it will also be evident that the use of the circuit arrangement described need not be limited to the European television standard, but the circuit arrangement may be suitable for any existing or future standard. The circuit arrangement may be provided in known manner with a change-over facility so that its use is possible for a plurality of standards.

We claim:

1. A circuit arrangement for the field deflection in a picture display device, comprising a sawtooth generator for generating a sawtooth-shaped signal having a trace and a retrace, and a field synchronizing circuit for generating a local field signal and for applying this signal to the sawtooth generator for each time initiating the retrace of the generated sawtooth-shaped signal, and for synchronizing the locally generated field signal with in incoming field synchronizing signal, characterized in that the circuit arrangement is provided with a switch operated by a control stage for switching over the duration of the retrace period between a first and second value, the second duration being shorter than the first, and in that a pulse shaper for deriving a signal from the local field signal for the supply thereof to the sawtooth generator is coupled to the field synchronizing circuit, which signal has substantially the same duration as the retrace of the sawtooth-shaped signal generated by the sawtooth generator, the pulse shaper including said switch for shortening or lengthening the duration of the said signal.

2. A circuit arrangement as claimed in claim 1, in which the sawtooth generator comprises a capacitor and means for successively charging the capacitor during the trace period and discharging it during the retrace period, characterized in that in the state of the switch in said pulse shaper in which the retrace period has the first duration, the signal generated by the pulse shaper temporarily interrupts the discharging of the capacitor.

3. A circuit arrangement as claimed in claim 2, characterized in that the pulse shaper includes a bistable element for generating a first pulse having a leading edge which substantially coincides with the instant of commencement of the retrace of the sawtooth-shaped signal, the duration between the leading edge and the trailing edge of the first pulse being substantially equal to the first value of the retrace period, the pulse shaper also including a subtractor stage for subtracting, in the said state of the switch, a second pulse having a duration which is equal to the difference between the first and the second duration of the retrace period.

4. A circuit arrangement as claimed in claim 3, in which the discharge of the capacitor ends when the voltage across the capacitor reaches a predetermined level, characterized in that the local signal from the field synchronizing circuit, which signal occurs at the instant of commencement of the retrace, is a signal for bringing the bistable element into one state and that a signal from the sawtooth generator, which signal occurs at the instant of ending the discharge of the capacitor, is a signal for bringing the bistable element into the other state thereof.

5. A circuit arrangement as claimed in claim 1, characterized in that for eliminating the interlacing of a picture to be displayed on a picture display tube upon reception of a video signal with interlacing the control signal applied by the control stage to the switch has the picture frequency for obtaining a sawtooth-shaped signal in which the retrace period alternately has the first and the second duration and in which the difference between the first and second duration is equal to half the line period in the incoming video signal.

6. A circuit arrangement as claimed in claim 1, characterized in that a memory circuit comprising a memory element is connected to the sawtooth generator, as well as a source for applying information to the memory element and a source for removing information from this element, which circuit also comprises a control loop for controlling the quantity of information stored in the memory element, which information has a predetermined substantially constant value when the interval between incoming field synchronizing pulses has a predetermined duration and a value deviating therefrom in the opposite case.

7. A circuit arrangement as claimed in claim 6, characterized in that the memory circuit comprises a first comparison stage coupled to the two sources for comparing the difference between information derived from the peak of the generated sawtooth-shaped signal and the information stored in the memory element with a first reference and for maintaining the information in the memory element at said substantially constant value when the interval between incoming field synchronizing pulses has the predetermined duration.

8. A circuit arrangement as claimed in claim 6, characterized in that the memory circuit comprises a second comparison stage coupled to a counter for comparing the difference between information derived from the peak of the sawtooth-shaped signal and the information stored in the memory element with a second reference for each time intitiating the retrace and for each time applying a signal to the control stage for changing over the switch to the state in which the retrace period has the second duration, the interval between the instants of commencement of the retrace periods being equal to said predetermined duration, and this in the absence of a plurality of successive incoming field synchronizing pulses, which plurality is not higher than a predetermined value.

9. A circuit arrangement as claimed in claim 8, characterized in that the difference between the first and the second duration of the retrace period is equal to half the line period in an incoming video signal which comprises the field synchronizing signal.

10. A circuit arrangement as claimed in claim 3, characterized in that the second pulse has a duration of half a line period.

11. A circuit arrangement as claimed in claim 8, characterized in that the counter is coupled to the information source for the memory element for increasing the quantity of information stored in the memory element and for lengthening the duration of the trace of the sawtooth-shaped signal in the absence of a plurality of successive incoming field synchronizing pulses, which plurality is higher than the said predetermined value.

12. A circuit arrangement as claimed in claim 8, characterized in that the memory circuit comprises a third comparison stage, coupled to the information removal source for the memory element, for comparing the difference between information derived from the peak of the generated sawtooth-shaped signal and the information stored in the memory element with a third reference for maintaining the quantity of information in the said element at or below a second predetermined value which is higher than the first-mentioned predetermined value.

13. A circuit arrangement as claimed in claim 6, characterized in that the memory circuit comprises a fourth comparision stage, coupled to the information source for the memory element, for comparing the difference between information derived from the peak of the generated sawtooth-shaped signal and the information stored in the memory element with a fourth reference for rapidly applying information to the said element if the quantity of information therein is many times smaller than the value which it has when the interval between incoming field synchronizing pulses has the predetermined duration.

14. A circuit arrangement as claimed in claim 6, characterized in that the memory circuit comprises means for rendering the control loop inoperative when a field synchronizing pulse occurs after the instant of commencement of the retrace.

15. A circuit arrangement as claimed in claim 14, characterized in that the memory circuit comprises a bistable element coupled to the information source, which element is in a first state after the instant of commencement of the retrace and is in a second state after the occurrence of a field synchronizing pulse, which second state causes information to be supplied to the memory element.

16. A circuit arrangement as claimed in claim 5, characterized in that the second duration is a duration of half a line period.

17. A circuit arrangement as claimed in claim 9, characterized in that the second duration is a duration of half a line period.

* * * * *